United States Patent [19]

Gasperi et al.

[11] Patent Number: 4,933,674
[45] Date of Patent: Jun. 12, 1990

[54] METHOD AND APPARATUS FOR CORRECTING RESOLVER ERRORS

[75] Inventors: Michael L. Gasperi, Racine; William G. Onarheim, Milwaukee, both of Wis.

[73] Assignee: Allen-Bradley Company, Inc., Milwaukee, Wis.

[21] Appl. No.: 619,315

[22] Filed: Jun. 11, 1984

[51] Int. Cl.[5] .............................................. H03M 1/64
[52] U.S. Cl. ................................... 341/116; 341/112; 341/115
[58] Field of Search ................... 340/347 SV, 347 CC, 340/347 AD; 318/604, 632; 73/1 E

[56] References Cited

U.S. PATENT DOCUMENTS 3,250,905  5/1966  Schroeder et al.
4,336,526  6/1982  Weir ........................ 340/347 CC X

OTHER PUBLICATIONS

Background Information–A/D Converters.
Synchro Conversion Handbook; Third Printing; ILC Data Device Corporation.

*Primary Examiner*—William M. Shoop, Jr.
*Assistant Examiner*—Brian K. Young
*Attorney, Agent, or Firm*—Quarles & Brady

[57] ABSTRACT

A synchro-to-digital converter circuit is disclosed which includes memories that store digitized representations of the waveforms produced by the resolver. By matching these digitized waveforms to the specific resolver with which the circuit is to be employed, errors produced by the resolver are compensated.

Two embodiments of the synchro-to-converter circuit are disclosed as well as a circuit for creating and storing the matched waveforms.

7 Claims, 4 Drawing Sheets

METHOD AND APPARATUS FOR CORRECTING RESOLVER ERRORS

BACKGROUND OF THE INVENTION

The field of the invention is position transducers and their related circuitry, and particularly, circuits for producing digital position signals from resolvers.

There are two basic types of position transducers used in industrial applications; encoders and resolvers. Encoders produce digital signals which indicate the angular orientation of a shaft. Resolvers, on the other hand, produce sinusoidal signals, and circuitry is required to convert these signals to a corresponding digital number which indicates the angular orientation of the resolver's shaft. While highly accurate encoders can be manufactured at a reasonable cost, encoders are inherently less rugged than resolvers because they require a light source and other optical elements.

Resolvers employ passive windings which are inherently rugged, but which must be precisely wound and aligned if highly accurate sinusoidal waveforms are to be produced. By using large scale integrated circuits, the conversion of these signals to digital numbers can be performed accurately and at reasonable cost. Nevertheless, resolvers capable of producing accurate, high resolution position signals are precision instruments which are relatively expensive to manufacture.

SUMMARY OF THE INVENTION

The present invention relates to an analog to digital converter circuit for a resolver which corrects for errors in the resolver output signals. More specifically, the present invention is an improvement to a synchro-to-digital tracking converter that employs a digitized reference waveform stored in a read-only memory as a means for sensing the angle of the resolver's shaft. The digitized reference waveform is matched to the waveform produced by the resolver, and hence, any misalignments or anomalies in the resolver winding waveform are captured in the digitized reference waveform and automatically compensated for in the operation of the synchro-to-digital tracking converter.

A general object of the invention is to produce a highly accurate digitized indication of resolver rotor angle. Synchro-to-digital tracking converters produce an accurate digitized output signal by generating a reference waveform which is compared with the waveform produced by a resolver winding. In prior circuits this reference waveform is sinusoidal in shape because that is the ideal shape of the waveform produced by resolver winding. It is a discovery of the present invention that resolvers actually produce less than ideal sinusiodal waveforms at their windings, and that such deviations from the ideal represent resolver errors which can be compensated. This compensation is accomplished by matching the digitized reference waveform produced by the synchro-to-digital converter with the resolver waveform to which it is compared.

Another aspect of the present invention is a method for matching a resolver to its synchro-to-digital converter. This is accomplished by digitizing the resolver winding waveform and storing it in a read-only memory. The read-only memory is then used in the synchro-to-digital converter circuit to produce the reference waveform. Any anomalies the resolver waveform due to misalignment of windings or the resolver shaft are thus captured in the digitized waveform and reproduced in the synchro-to-digital converter circuit.

Another general object of the invention is to produce highly accurate indications of rotor angle with inexpensive resolvers. Costly mechanical measures required to reduce resolver errors are no longer needed. Instead, such errors are automatically eliminated by matching the resolver to the synchro-to-digital converter with which it operates.

Yet another aspect of the present invention is an improved synchro-to-digital converter circuit. Improved performance and lower cost is achieved by converting the measured analog angle error signal to a single-bit digital signal which indicates either a positive error or a negative error. This digital error signal is used to drive a counter in a direction which reduces the measured error. Integrators and other analog circuits are eliminated from the tracking loop to both reduce cost and improve tracking loop stability and response time.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of this invention.

DESCRIPTION OF THE PREFERRED EMBODIMENT

There are two aspects to the present invention: the making of a read-only memory which stores a digitized replication of a resolver output waveform, and the use of the read-only memory in a synchro-to-digital converter circuit. The making of the read-only memory will be described first with reference to FIG. 1, and its use will then be described with reference to FIG. 2.

Figure 1:
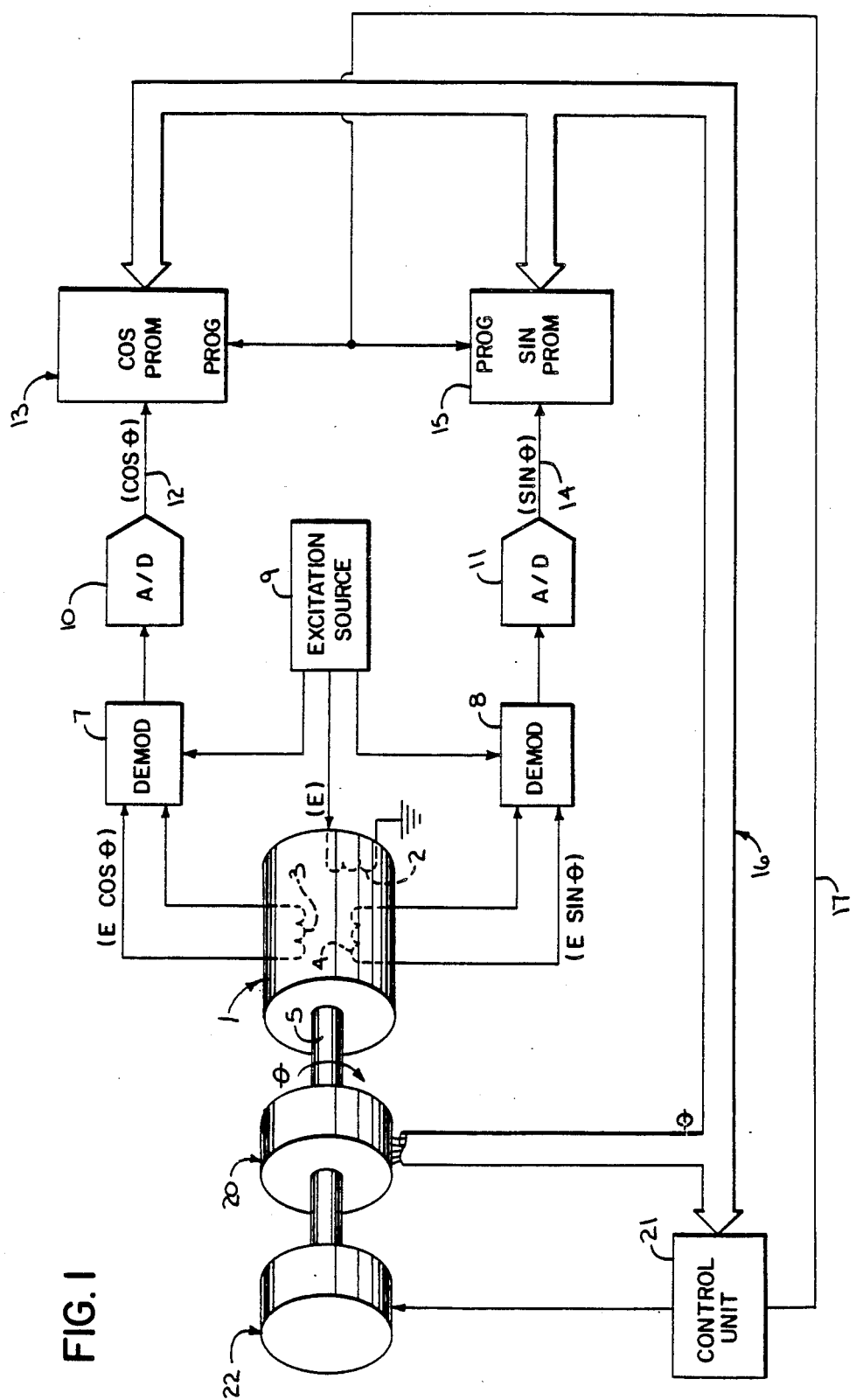
FIG. 1 is a circuit diagram of an apparatus which is employed to program PROMs according to the present invention.

Referring particularly to FIG. 1, a synchro, or resolver 1, receives an excitation signal, or carrier (E), at its rotor winding 2 and induces a voltage into two stator windings 3 and 4. The amplitudes of the induced voltages are a function of the angle $\theta$ of the resolver's shaft 5, with the amplitudes ideally mapping out perfect cosine and sine waves as the shaft is rotated through 360 degrees. Despite the best efforts of resolver manufacturers, such ideal waveforms are not produced, and instead amplitude and phase errors occur due to imprecise placement of the windings 2–4 and inaccuracies in the machining of the rotor and stator elements.

The winding 3 is connected to a synchronous demodulator 7 which also receives the excitation signal (E) and which removes the carrier from the signal induced in the winding 3. The demodulated signal is applied to the input of an analog-to-digital converter 10. The output of A/D converter 10 is a 12-bit binary number which corresponds to the amplitude of the signal induced in winding 3, and it is applied through a bus 12 to the data terminals on a COSINE PROM 13. Similarly, the winding 4 connects to a synchronous demodulator 8 which drives an A/D converter 11 that produces a 12-bit binary number which is applied through a bus 14 to the data terminals on a SINE PROM 15. The PROMs 13 and 15 are 2732 UVPROMs which contain 4K separately addressable memory locations which are connected to form 12-bit words. A memory location is selected by a 12-bit address code applied through an address bus 16 and the 12-bit amplitude numbers are programmed into the selected memory location when a programming pulse is applied to control line 17.

A 12-bit shaft encoder 20 is coupled to the resolver shaft 5 and its outputs are connected to the address bus 16. As the resolver rotor 5 is rotated through 360 degrees the shaft encoder 20 produces a 12-bit binary number which corresponds to the actual rotor angle $\theta$. A control circuit 21 receives the output of the shaft encoder 20 through address bus 16 and each time the 12-bit number changes, the control circuit 21 produces a programming pulse on the control line 17. Thus, as the shaft 5 is rotated and successive addresses are produced by the shaft encoder 20, the signals produced by the resolver stator windings 3 and 4 are digitized and stored in successive memory locations of the PROMs 13 and 15. The control circuit 21 operates a servo motor 22 which is coupled to rotate the resolver shaft 5 at a sufficiently slow rate as to allow the programming of the PROMs 13 and 15 at each state change of the shaft encoder output.

While the signals produced by the resolver stator windings 3 and 4 are substantially sinusoidal in shape, these waveforms are now stored in digital form in the respective PROMs 13 and 15 exactly as produced by the resolver, including any anomalies. The shaft encoder 20 is a precision device and this is effectively transferred to the resolver 1 when the resolver 1 is used in combination with its "matched" PROMs 13 and 15 in the circuit of FIG. 2.

There are a number of alternative circuits which may be used to program the SINE and COSINE PROMS 13 and 15. For example, in place of the servo motor 22 and encoder 20 a stepping motor with gear reduction may be employed to rotate the shaft 5 in known increments. This alternative eliminates the need for a highly accurate shaft encoder and the control circuit 21 is simplified because stepping motors require little drive circuitry. Yet another possible variation is to drive the resolver, shaft at a constant velocity in synchronism with a 12-bit counter. During successive revolutions, the resolver is sampled and digitized at progressively higher counter values. Synchronization is achieved by a single bit shaft encoder which marks a specific resolver shaft angle and which resets the counter for another revolution.

Figure 2:
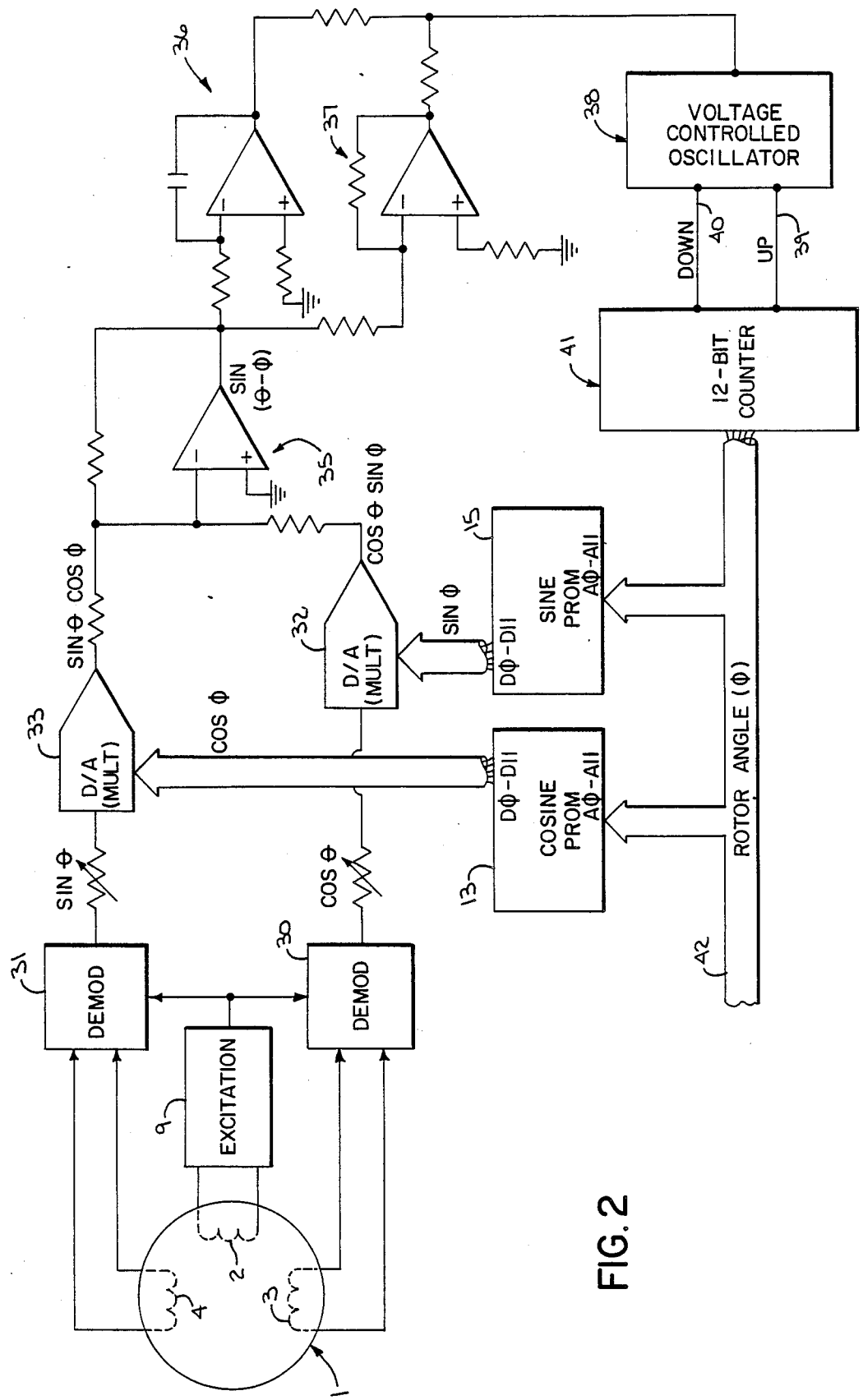
FIG. 2 is a circuit diagram of a synchro-to-digital converter circuit which employs the present invention.

Referring particularly to FIG. 2, the resolver 1 and its matched PROMs 13 and 15 are employed in a synchro-to-digital tracking converter. The windings 3 and 4 connect to respective demodulator circuits 30 and 31, and the substantially sinusoidal waveforms (COS$\theta$ and SIN$\theta$) which they produce as the shaft 5 is rotated are applied to the analog inputs of respective multiplying digital-to-analog converter circuits 32 and 33. The digital inputs to these D/A converters 32 and 33 are driven by the 12-bit binary numbers read from the respective PROMs 15 and 13. As will become apparent from the description below, these binary numbers correspond to the amplitudes SIN$\phi$ and COS$\phi$, where $\phi$ is the resolver rotor angle as measured by the circuit.

The analog signal (SIN$\theta$ COS$\phi$) which is produced by the D/A converter 33 is subtracted from the analog signal (COS$\theta$ SIN$\phi$) produced by the D/A converter 32. This subtraction is performed by an operational amplifier 35 which produces an analog error signal SIN($\theta - \phi$). For small values of $\theta - \phi$, this analog error signal is approximately equal to the difference between the actual rotor angle $\theta$ and the measured rotor angle $\phi$. This error signal is integrated by an integrator circuit 36 and a proportional amplifier 37 and it is applied to the input of a voltage controlled oscillator (VCO) 38. The VCO 38 produces "UP" pulses on a line 39 when the measured angle $\phi$ is less than the actual rotor angle $\theta$, and it produces "DOWN" pulses on a line 40 when the measured angle $\phi$ is greater.

These pulses are added, or subtracted from a binary number stored in a 12-bit counter 41. The 12-bit counter 41 thus stores a number which tracks the actual rotor angle $\theta$, and its output is a binary number which equals the measured rotor angle $\phi$. This number is applied to a bus 42 which connects to the address terminals on the PROMs 13 and 15.

The above-described synchro-to-digital converter is a conventional circuit that operates as a type II servo in which the measured angle $\phi$ is forced to follow, or track, the resolver rotor angle $\theta$. Unlike prior circuits of this nature, however, the measured angle $\phi$ produces output signals (COS$\phi$ and SIN$\phi$) from the PROMs 13 and 15 which not only close the servo loop, but also, compensate for any errors which appear in the resolver signals (SIN$\theta$ and COS$\theta$) due to inaccuracies in the resolver itself. The 12-bit number appearing on the bus 42 is thus a very accurate indication of the actual rotor angle $\theta$.

Figure 3:
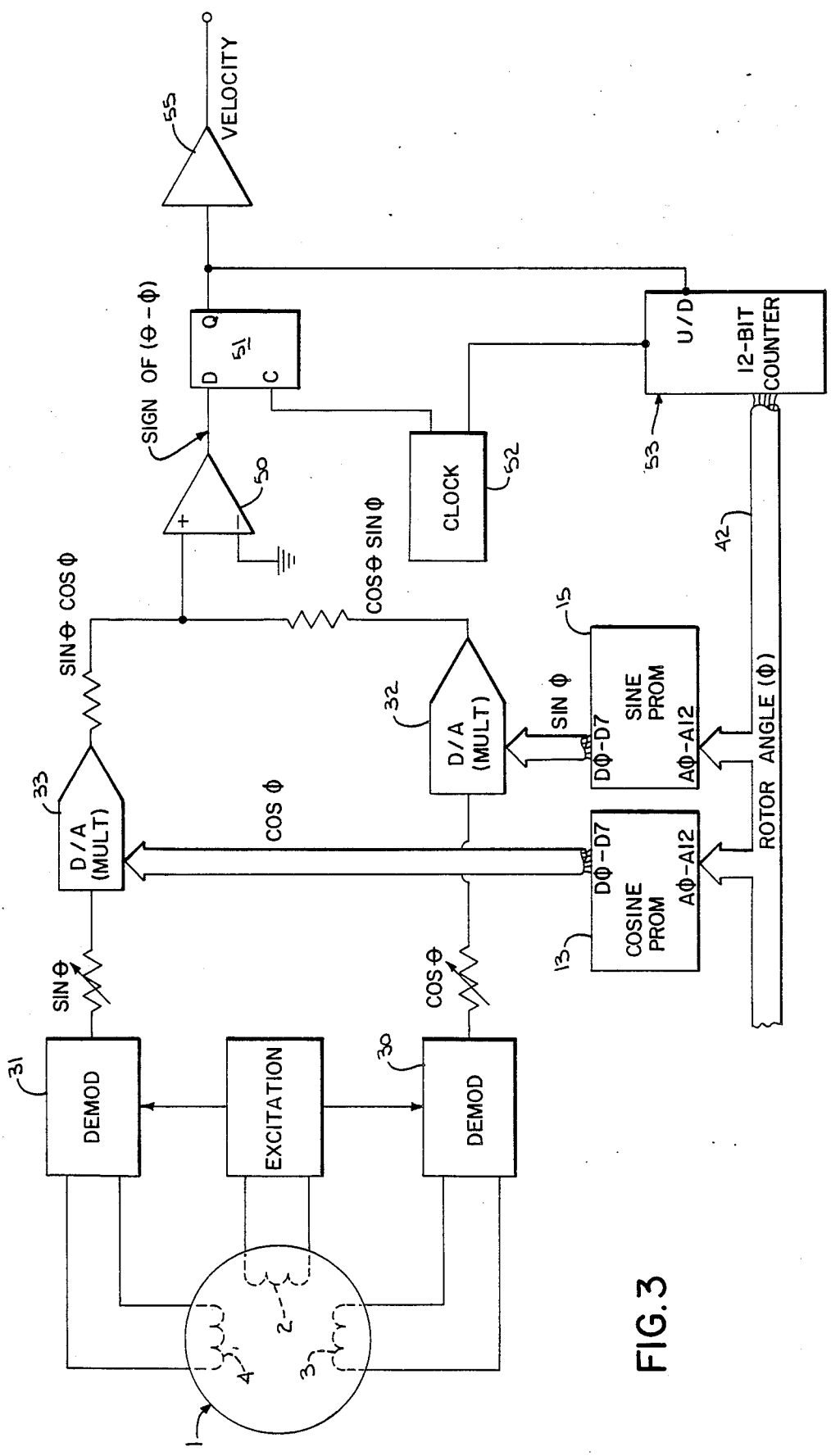
FIG. 3 is a circuit diagram of an alternative embodiment of a synchro-to-digital converter circuit which employs the present invention.

The present invention has also led to an improved synchro-to-digital converter circuit which is shown in FIG. 3. Many of the elements of this improved circuit are the same as those used in the circuit of FIG. 2 described above, and the same reference numbers are used for like elements. As with the circuit of FIG. 2, the resolver signals are demodulated by synchronous demodulators 30 and 31 and are multiplied with the digital signals sin$\phi$ and cos$\phi$ in the D/A converters 32 and 33. The difference between the two signals sin$\theta$ cos$\phi$ and cos$\theta$ sin$\phi$ is then obtained at a comparator circuit 50.

The comparator 50 generates a logic high +5 volts at its output when the resolver angle $\theta$ exceeds the measured angle $\phi$. It generates a logic low output voltage when the measured angle $\phi$ exceeds the resolver angle $\theta$, and this output voltage is applied to the D input of a D-type flip-flop 51. The C input on the flip-flop 51 is driven by a clock 52 which also drives the input on a 12-bit up/down counter 53. The state of the comparator output is thus periodically latched in the flip-flop 51 and is produced at the Q output.

The Q output of the flip-flop 51 drives the up/down terminal on the counter 53. Thus, each time the comparator circuit output is latched in the flip-flop 51, the counter 53 is pulsed by the clock 52 and a count is either added to or subtracted from the rotor angle number ($\phi$) stored in the counter 53. As with the circuit of FIG. 2, this measured rotor angle ($\phi$) is fed back via the cosine PROM 13 and sine PROM 15 to close the loop and thereby force the measured angle ($\phi$) to follow the actual rotor angle ($\theta$).

The circuit of FIG. 3 offers a number of advantages over the first embodiment. First, there are fewer elements in the circuit and there are no analog integrators in the closed loop. Both of these factors enable the circuitry to more readily be embodied in integrated circuit form. Also, the lack of an integrator circuit improves both the response time of the circuit to changes in rotor angle ($\theta$) and it improves loop stability.

Another advantage of the present invention is the ability to obtain not only a digital indication of rotor angle, but also, an indication of rotor velocity. Referring to FIG. 3, a filter circuit 55 has its input connected to the Q output of the flip-flop 51. The filter 55 is a low pass filter which removes signals at and above the frequency of the clock 52. Its output is a voltage between zero and five volts, with 2.5 volts indicating zero rotor velocity. Voltages above 2.5 volts are proportional to rotor velocity in one direction and voltages below 2.5 volts are proportional to rotor velocity in the other direction.

Figure 4:
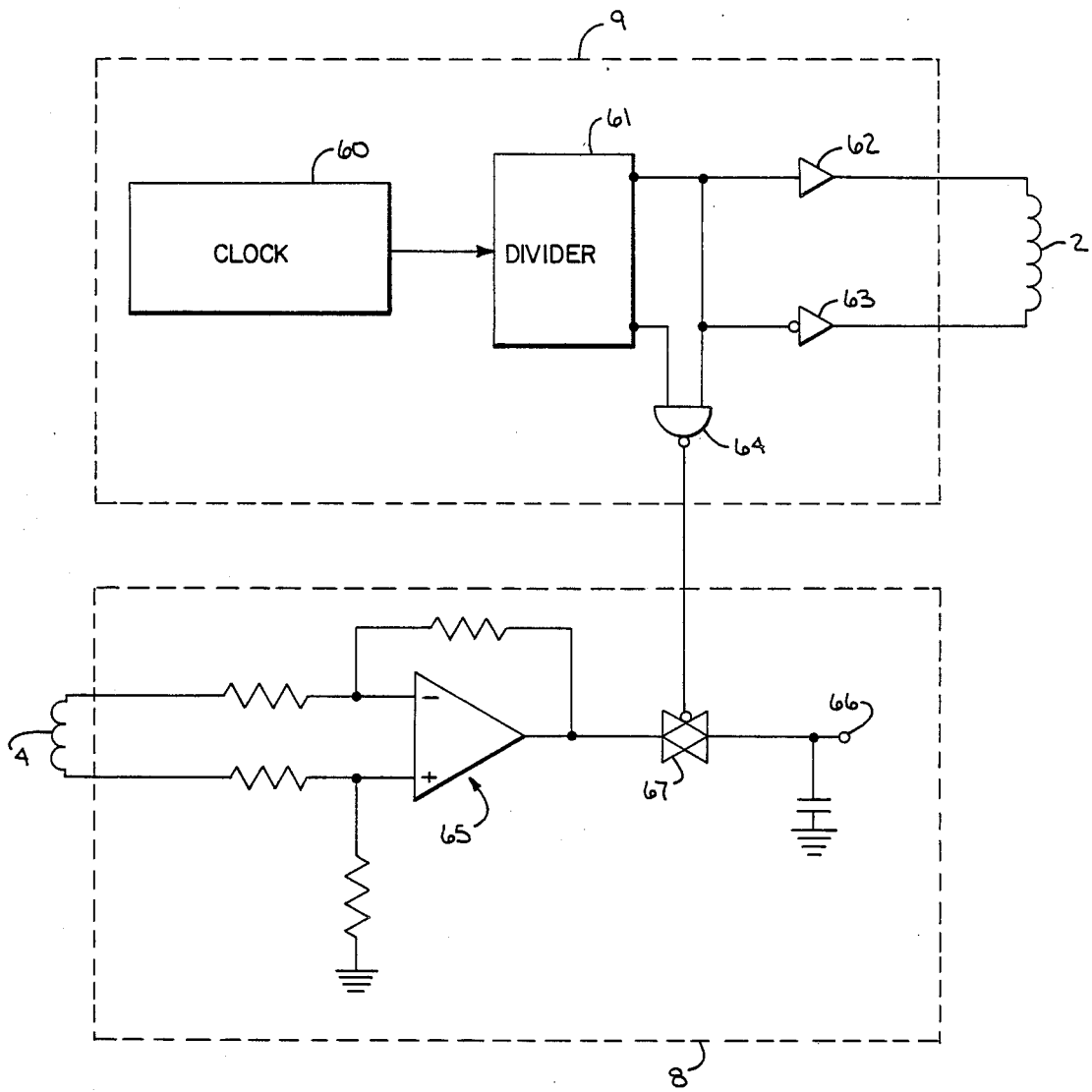
FIG. 4 is a circuit diagram of an excitation circuit and a synchronous demodulator circuit which are employed in the circuits of FIGS. 1–3.

Referring particularly to FIG. 4, the resolver excitation circuit 9 which is employed in the above-described circuits includes a clock 60 which drives a 2-bit counter 61 that operates as a divider. Square waves at the clock frequency are output to a pair of drives 62 and 63 which connect to the resolver rotor winding 2. Both outputs of the divider 61 are connected to a NAND gate 64 which provides the clock signal for the synchronous demodulators 7 and 8 or 30 and 31.

The synchronous demodulator 8 is shown in FIG. 4, and it includes a differential input amplifier circuit 65 connected to the rotor winding 4. The output of the amplifier 65 is coupled to the demodulator's output 66 through an analog switch 67. The analog switch 67 is controlled by the NAND gate 64 to close when the resolver signal produced by the winding 4 is maximum. This same demodulator circuit is employed for the demodulators 7, 30 and 31, and numerous others are well known to the art.

| Component Index | |
|---|---|
| A/D Converters 10, 11 | Twelve-bit analog-to-digital converters (AD 574A) manufactured by Analog Devices. |
| PROMS 13, 15 | 8-bit by 4K UV PROMS (2732) manufactured by Intel, Inc. |
| Control Unit 21 | 8-bit microcomputer (MC 6801) manufactured by Motorola. |
| D/A Converters 32, 33 | 12-bit multiplying digital-to-analog converter (AD 7541A) manufactured by Analog Devices. |
| Operational Amplifiers 35, 36, 37, 55, 65 | Operational amplifier (uA741) manufactured by Fairchild Camera and Instrument Corporation. |
| Counters 41, 53 | Three, 4-bit up/down counters (SN74193) manufactured by Texas Instruments, Inc. |
| Comparator 50 | Voltage comparator (uAF311) manufactured by Fairchild Camera and Instrument Corporation. |
| Flip-flop 51 and Divider 61 | Dual D-type edge-triggered flip-flops (SN7474) manufactured by Texas Instruments, Inc. |

We claim:

1. In a rotary transducer converter circuit that uses a read-only memory for storing a digitized waveform matched to the actual rotary transducer output for the purpose of correcting anomalies in the rotary transducer, a method for producing the read-only memory which comprises;
   operate a rotary transducer to produce an actual signal which the digitized waveform is to replicate, said actual signal being the demodulated output of the rotary transducer winding;
   (b) convert the actual signal to a digital number equal to the total instantaneous amplitude of the actual signal;
   (c) measure the angle of the rotary transducer shaft and produce a corresponding digital address;
   (d) store the digital number in the read-only memory at the memory location indicated by the digital address;
   (e) repeatedly rotate the rotary transducer's shaft an incremental amount and repeat steps (a) through (d) to store a series of digital numbers in the read-only memory which replicates the actual signal produced by the rotary transducer over a selected range of rotary transducer shaft angles.

2. A rotary transducer apparatus for correcting anomalies in the rotary transducer which comprises:
   transducer means which includes:
      a rotary transducer having an input shaft; and demodulator means coupled to the rotary transducer which produces a transducer signal, the amplitude of which corresponds to the instantaneous angle ($\theta$) of the transducer input shaft, said amplitude when taken along a range of shaft angles defining an actual transducer waveform;
   up/down counter means which stores a count indicative of a measured angle ($\phi$);
   a memory, the address input of which is connected to receive the count from the up/down counter means, said memory storing at successive memory locations a digitized waveform which corresponds to the actual transducer waveform, the memory being thereby matched to the anomalies in the rotary transducer, said memory producing a digital number at its output which corresponds to the amplitude of the digitized waveform at the angle ($\phi$) indicated by the up/down counter means; and
   control means connected to the transducer means and the memory for receiving the transducer signal and combining it with the digital number to produce a difference signal indicative of the difference between the transducer angle ($\theta$) and the measure angle ($\phi$), said difference signal being connected to the up/down counter means;
   wherein the up/down counter means responds to the difference signal by changing said count in a direction which results in a reduction of said difference.

3. The rotary transducer apparatus as recited in claim 2 wherein the difference signal produced by said control means is a single-bit logic signal which indicates either that the rotary transducer angle ($\theta$) is greater than or is less than the measured angle ($\phi$).

4. The rotary transducer apparatus as recited in claim 3 wherein the up/down counter means includes:
   a latch connected to receive said logic difference signal and providing a latched output signal;
   an up/down counter connected to receive the latched output signal for controlling the direction in which the count changes; and
   a clock which generates a continuous stream of clock pulses, said clock pulses being connected to the latch and to the up/down counter;

wherein the up/down counter changes the count for each clock pulse received, the count being incremented when the latched output signal indicates that the rotary transducer angle ($\theta$) is greater than the measured angle ($\phi$), and the count being decremented when the single-bit logic signal indicates that the rotary transducer angle ($\theta$) is less than the measured angle ($\phi$).

5. The rotary transducer apparatus as recited in claim 4 in which filter means connects to the latch and produces an analog output voltage which is indicative of rotary transducer shaft velocity.

6. The rotary transducer apparatus as recited in claim 2 wherein the difference signal produced by said control means is an analog signal indicative of the direction and magnitude of said difference.

7. The rotary transducer apparatus as recited in claim 6 wherein the up/down counter means includes:

analog integrator means connected to receive said analog difference signal and producing an analog output signal which is a time integration of the analog difference signal;

a Voltage Controlled Oscillator (VCO) connected to receive the analog output of the analog integrator means and produce a VCO output signal indicative of the direction in which the count must be changed in order to reduce said analog difference signal; and an up/down counter connected to receive the VCO output signal, said up/down counter changing the count in the direction indicated by the VCO output signal.

* * * * *